United States Patent [19]

Korinsky

[11] Patent Number: 5,419,629

[45] Date of Patent: May 30, 1995

[54] ELECTRONICS CHASSIS AND METHOD OF MANUFACTURE THEREFOR

[75] Inventor: George K. Korinsky, The Woodlands, Tex.

[73] Assignee: Compaq Computer Corporation, Houston, Tex.

[21] Appl. No.: 187,451

[22] Filed: Jan. 27, 1994

[51] Int. Cl.[6] .............................................. A47B 47/02
[52] U.S. Cl. .................................. 312/263; 312/223.2; 312/7.2; 361/685
[58] Field of Search ..................... 312/7.2, 223.2, 236, 312/263; 361/685

[56] References Cited

U.S. PATENT DOCUMENTS

| | | | |
|---|---|---|---|
| 744,405 | 11/1903 | Reno | 312/263 |
| 1,129,040 | 2/1915 | McClure | 312/263 |
| 1,162,798 | 12/1915 | Morton | 312/263 |
| 1,573,254 | 2/1926 | Lachaine | 312/263 |
| 2,443,515 | 6/1948 | Rockwell | 312/263 |
| 2,839,348 | 6/1958 | Giannini | 312/263 |
| 4,014,598 | 3/1977 | Stalley et al. | 312/236 |
| 4,880,594 | 11/1989 | Fu | 312/7.2 |
| 4,909,579 | 3/1990 | Liu | 312/223.2 |
| 4,992,903 | 2/1991 | Chen | 361/685 |
| 5,121,296 | 6/1992 | Hsu | 361/685 |

Primary Examiner—Kenneth J. Dorner
Assistant Examiner—Rodney B. White
Attorney, Agent, or Firm—Konneker & Bush

[57] ABSTRACT

An electronics chassis, preferably a personal computer ("PC") power supply chassis, having a construction free of secondary fabrication operations and a method of manufacture therefor. The chassis comprises: (1) a bendable chassis sheet having a central portion forming a chassis base wall and a plurality of peripheral portions bent with respect to the central portion to form chassis side walls, edges of the side walls having projections interlocking with corresponding projections on edges of the side wall to fix the side walls with respect to the side wall as against lateral displacement, the bendable chassis sheet thereby forming a chassis portion having an opening therein, (2) a second bendable chassis sheet mated to the first chassis sheet and covering the opening, the second chassis sheet having a portion forming a chassis cover wall and a second portion bent with respect to the portion to form a fourth chassis side wall, side edges of the cover wall and outer edges of the side walls having interlocking projections and recesses preventing the side walls from separating from the cover wall, (3) structures for removably attaching a cover wall to an outer edge of the second wall and a side wall to a base wall.

10 Claims, 3 Drawing Sheets

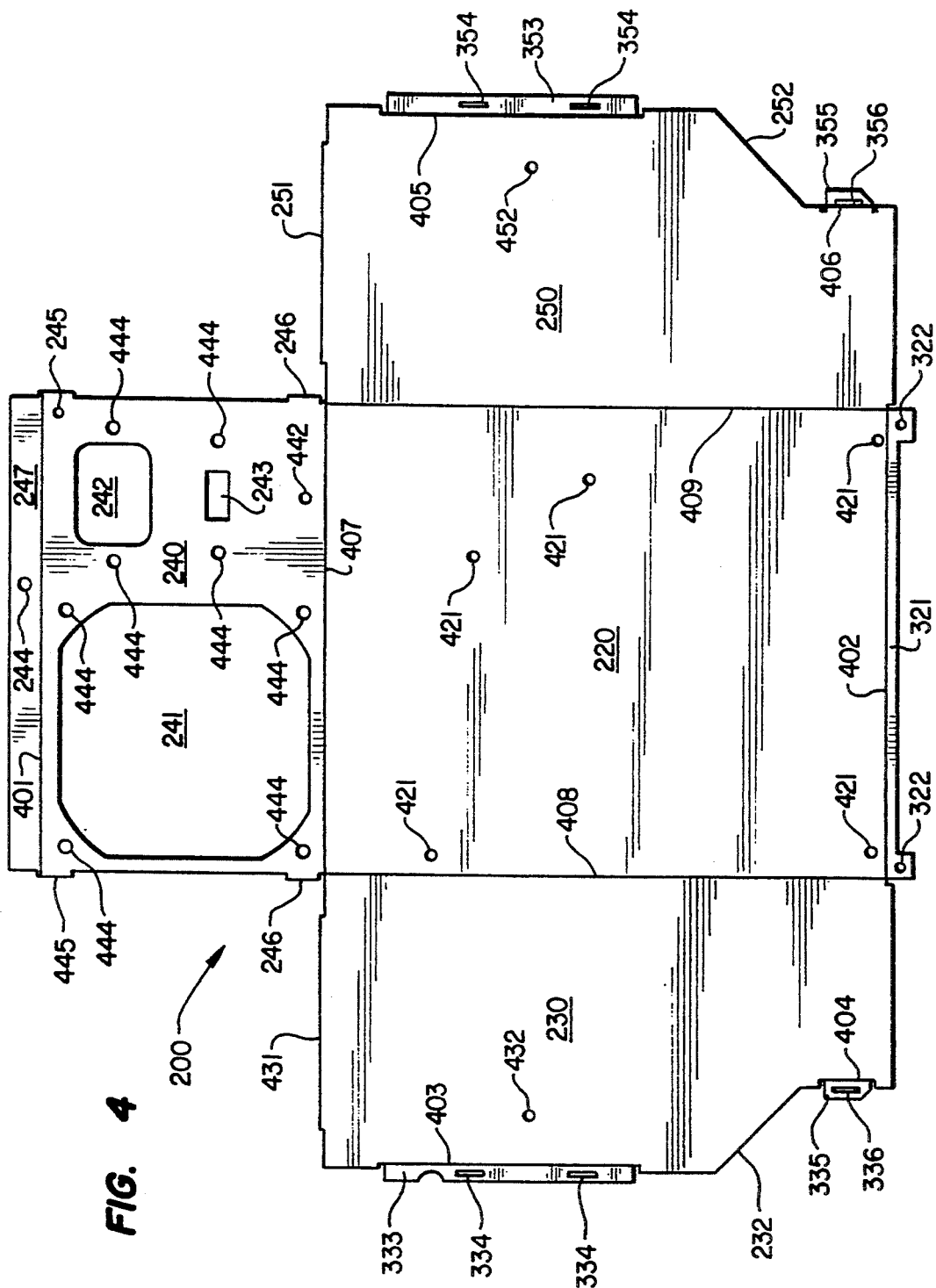

ELECTRONICS CHASSIS AND METHOD OF MANUFACTURE THEREFOR

BACKGROUND OF THE INVENTION

1. Field of the Invention

The present invention is directed, in general, to electronics chassis and, more particularly, to such chassis adapted for use as a power supply chassis and having a simplified construction.

2. Description of Related Art

In the past, the manufacture of electronics chasses for computer equipment and for personal computer ("PC") power supplies, in particular, was at least a three step process depending, in large part, on the final desired shape of the chassis, the manner in which the chassis was to be secured to its environment and the manner in which the electronic components were to be secured within the chassis.

The manufacture of a typical prior art chassis was a three-step process begun first by stamping portions of the chassis out of sheet metal with a die press. The stamping step yielded one or more flat sheets of metal having shapes that could be bent to form portions of the finished chassis. Each flat sheet of metal was then bent to produce various walls of the chassis. In doing so, various edges of the flat sheet were brought into proximity with one another to form edges and corners of the chassis.

Prior art chassis manufacturing processes required, as a second step, so-called secondary fabrication operations, such as brazing, cementing or riveting (and subsequently defined in greater detail), to lock the various edges to one another so as to form a rigid, mechanically sturdy chassis, to form a barrier as against electromagnetic interference ("EMI") emanating from the components in the chassis or circuitry within the computer system and to form good electrical conductivity in the chassis for grounding purposes. Once the secondary operations were complete, the various chassis portions were ready to be removably joined together, in a third step, to form the final, assembled chassis.

Unfortunately, the prior art secondary fabrication operations required extra time, effort and machinery to perform, resulting in slower, more costly, more complicated and more error-prone manufacture of prior art chassis.

What is needed in the art is a chassis construction and method of manufacture therefor that obviates a need to apply secondary fabrication operations to the manufacture of chassis portions, thereby eliminating one of the three steps previously required in the manufacture of chasses.

SUMMARY OF THE INVENTION

To solve the above-discussed deficiencies of the prior art, it is a primary object of the present invention to provide an electronics chassis that does not require secondary fabrication operations, such those involving molten or cold bonding or application of mechanical fasteners, thereby eliminating the second of three prior art manufacturing steps.

Thus, it is a primary object of the present invention to provide an electronics chassis for which the portions can be manufactured through a progressive die process involving stamping and bending of sheet metal.

In the attainment of the above-described primary object, the present invention provides an electronics chassis having a construction free of secondary fabrication operations and a method of manufacture therefor. The chassis comprises: (1) a first bendable chassis sheet having a central portion forming a chassis base wall and a plurality of peripheral portions bent with respect to the central portion to form respective first, second and third chassis side walls, edges of the first and third side walls having projections interlocking with corresponding projections on edges of the second side wall to fix the first and third side walls with respect to the second side wall as against lateral displacement, the first bendable chassis sheet thereby forming a chassis portion having an opening therein. The chassis further comprises (2) a second bendable chassis sheet mated to the first chassis sheet and covering the opening, the second chassis sheet having a first portion forming a chassis cover wall and a second portion bent with respect to the first portion to form a fourth chassis side wall, side edges of the cover wall and outer edges of the first and third side walls having interlocking projections and recesses preventing the first and third side walls from separating from the cover wall. Finally, the chassis comprises (3) a structure for removably attaching a side edge of the cover wall to an outer edge of the second wall and (4) a structure for removably attaching an edge of the fourth side wall to an edge of the base wall. Preferably, the chassis is a power supply chassis for a PC.

As is apparent from the above, the present invention provides a chassis having two portions that interlock and can be removably fixed to one another to provide a strong, mechanically stable chassis suitable for containing electronic components, for shielding EMI produced by the components to prevent their potentially harmful effects and for providing good conductivity in the chassis for grounding purposes.

The primary advantage afforded by the present invention is that manufacture of the chassis does not involve secondary fabrication operations. For purposes of the present invention, "secondary fabrication operations" is defined to be any manufacturing operation occurring apart from and most typically after the primary fabrication operations of stamping and bending, each a part of progressive die fabrication. Secondary fabrication operations include (1) molten bonding operations, such as brazing, soldering, sweating and welding; (2) cold bonding operations, such as gluing and cementing and (3) applying mechanical fasteners, such as sweging, riveting, nailing, bolting or screwing.

The present invention dispenses with a need for secondary manufacturing operations in producing the first and second chassis portions, since the portions are provided with interlocking edges that reinforce one another when brought into proximity and when the first and second portions are removably secured to one another. Thus, only stamping and bending are required to finish the portions and to place them in condition to be removably joined pending insertion of appropriate electronic circuitry.

In a preferred embodiment of the present invention, the second side wall contains an aperture for receiving a fan. Therefore, the chassis can be provided with a fan to cool components within the chassis. In a similar vein, the fourth side wall may contain a plurality of ventilation apertures. The ventilation apertures may cooperate with the fan to allow cross-ventilation of the components in the chassis.

In a preferred embodiment of the present invention, the side edges of the cover wall contain a plurality of projections and the outer edges of the first and third side walls contain a plurality of corresponding recesses for receiving the projections. Thus, when the cover wall is lowered in place to cover the opening, the plurality of projections in the side edges enter and engage with the corresponding plurality of recesses to provide positive engagement of the cover wall with the first and third walls to prevent the first and third walls from being urged either inward or outward under external force.

In a preferred embodiment of the present invention, the first and second bendable chassis sheets are composed of metal. Metal is uniquely bendable, durable and resistant to EMI. However, those skilled in the art will recognize that other materials, such as plastic, are suitable substitutes in some applications.

In a preferred embodiment of the present invention, the second side wall contains an aperture for receiving a line cord interface. This allows power to be provided to the components within the chassis. In this embodiment, an angled portion of the cover wall contains an aperture for receiving a plurality of computer power supply lines therethrough, the computer power supply lines capable of providing power to components within a computer system. Thus, in this embodiment, the fourth wall is located toward the interior of a main chassis containing the computer system. The second wall is therefore toward the exterior, allowing a line cord to be plugged in to the line cord interface in a conventional manner.

In one embodiment of the present invention, the first, second, third and fourth side walls are substantially perpendicular to the base and cover walls. Thus, the chassis is generally conventionally orthogonal in angle to fit within a larger main computer chassis. In an embodiment to be illustrated herein, the first and third side walls have corresponding stepped portions in which a dimension of the first and third side walls changes, the cover wall having a corresponding angled portion to conform to the stepped portions. The present invention need not be limited to orthogonal chasses.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates a plan view of the first chassis portion of FIG. 3 after the step of stamping and prior to the step of bending.

DETAILED DESCRIPTION

Figures 1, 2:
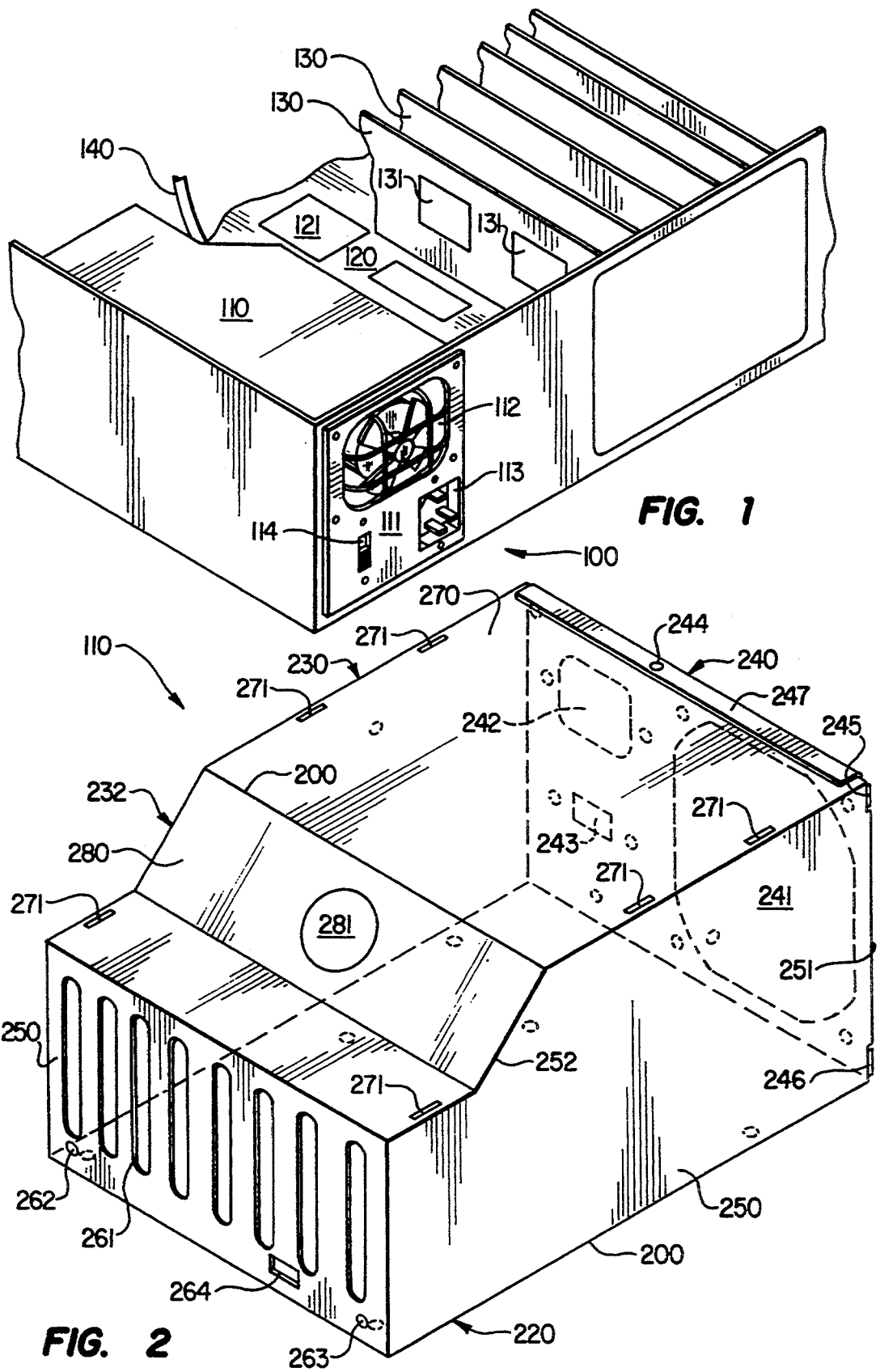
FIG. 1 illustrates a rearside isometric view of an exposed main chassis of a computer system providing an environment in which the chassis of the present invention can operate.
FIG. 2 illustrates a side isometric view of the chassis of FIG. 1, including both first and second chassis portions.

Referring initially to FIG. 1, illustrated is a rearside isometric view of an exposed main chassis of a computer system providing an environment in which the chassis of the present invention can operate. The main chassis, generally designated 100, may be, but for a power supply chassis 110 constructed according to the present invention, of conventional construction and commonly employed as part of a PC computer system. The main chassis 100 is shown exposed to illustrate the relationship of the several mechanical and electrical components present in a typical main chassis 100. A motherboard 120 typically lies in a horizontal orientation proximate a lower surface of the main chassis 100. The motherboard 120 typically contains a microprocessor central processing unit ("CPU") 121 and other computer circuitry central to electrical operation of the computer system. A plurality of expansion cards 130 are removably inserted into expansion slots (not shown) of the motherboard 120, allowing the computer system to accommodate functional expansion to fit a user's particular needs. The expansion cards 130 typically contain ancillary computer circuitry 131 allowing the computer to, for instance, drive a video display, access disk and tape-based memory, access a network or communicate via a modem.

As is commonly understood, the CPU and other circuitry 121, 131, and attendant hardware, such as disk and tape drives, need reliable electrical power to function properly. Accordingly, it has been conventional for many years to provide a power supply containing components employed to convert household power to a current and voltage level suitable for powering the CPU and other circuitry 121, 131 and attendant hardware. As previously stated, it has been commonplace to provide a conductive enclosure for the components of the power supply to separate the components both electrically and magnetically from the CPU and other circuitry 121, 131 to prevent either from deleteriously affecting the other. The present invention, as has also been previously stated, is directed to an enclosure or chassis that provides such electrical and magnetic isolation without requiring as many steps during manufacture and assembly as prior art chasses.

Accordingly, FIG. 1 shows a chassis 110 embodying the present invention residing within the main chassis 100. Since FIG. 1 is a rearside view, the chassis 110 is illustrated as being located in the right rear quadrant of the main chassis 100 when viewed from the front of the main chassis 100. A rear surface 111 of the chassis 110 is therefore exposed to an exterior of the main chassis 100.

Exposure of the rear surface 111 allows for two advantages. First, an electric fan 112 can be mounted into a wall of the chassis 110 to move air into or out of the chassis 110 to cool components therein. Because current PCs require power supplies having the capability of producing from a few to several hundred watts of power and because current power supply circuitry switches power to regulate voltage, the components are sensitive to heat and must be kept within operating temperature ranges.

Second, a line cord interface 113 can be mounted to allow a line cord (not shown) to supply electric power to the computer via the power supply. A plurality of computer power supply lines 140 emerge from the chassis 110 to power the CPU and other circuitry 121 within the computer system in a conventional manner. A voltage select switch 114 can further allow a user to select which of two possible line voltages will be used. The fan 112, line cord interface 113 and voltage select switch 114 are conventional.

Turning now to FIG. 2, illustrated is a side isometric view of the chassis 110 of FIG. 1, including both first and second chassis portions. The chassis 110 of FIG. 2 is shown on its side because its construction and method of manufacture are more readily understood in this configuration.

The chassis 110 comprises a first chassis portion 200 and a second chassis portion 210 formed from bendable sheets. The first and second chassis portions 200, 210 are each preferably formed of a single sheet of material, preferably metal. Through a process of stamping and bending, each of the first and second chassis portions 200, 210 are formed from bendable sheets sized and bent into a number of walls that cooperate to form sides of the chassis 110.

Specifically, the first chassis portion 200 forms a chassis base wall 220 and first, second and third chassis side walls 230, 240, 250. The second side wall 240 provides the exposed rear surface 111 of FIG. 1. Accordingly, the second side wall 240 is provided with apertures 241, 242, 243 sized appropriately to receive a fan, a line cord interface and a voltage select switch, respectively. An edge 247 of the second side wall 240 is bent with respect to the remainder of the second side wall 240 to function in a manner to be detailed later. The second side wall 240 has two other edges, one of which is illustrated in FIG. 2. The illustrated edge has projections 245, 246 that, in the illustrated embodiment, project no more than the thickness of the third side wall 250. The projections 245, 246 cooperate with a corresponding projection 251 (again, preferably no longer than the thickness of the second side wall 240) on the third side wall 250 to prevent the second and third side walls 240, 250 from shifting or displacing laterally with respect to one another when a twisting force is placed on the chassis 110 as a whole. Corresponding projections (not shown in FIG. 2) likewise prevent the first and second side walls 230, 240 from shifting laterally with respect to one another. This lends substantial strength and stability to the chassis and, as will be described, helps to eliminate a need for secondary fabrication operations to secure the first, second and third side walls 230, 240, 250 to one another during manufacture of the chassis 110. When the first chassis portion 200 is completely stamped and bent into its final configuration, the first chassis portion 200 forms the majority of the chassis 110, except for a substantial opening therein to be covered by the second chassis portion 210.

The second chassis portion 210 forms a chassis cover wall 270 and a fourth chassis side wall 260. The fourth side wall is provided with a plurality of apertures 261 that facilitate the movement of air through the chassis 110 to cool components therein, particularly to provide cross-flow of air under assist from the fan. The fourth side wall 260 further preferably contains a generally rectangular aperture 264 for receiving one or more light-emitting diodes ("LEDs") used to indicate power supply operational status. Finally, the fourth side wall 260 contains two screw-holes 262, 263 adapted to receive screws therethrough. Corresponding screw-holes are provided in an upturned lip (321 of FIG. 3) on an edge of the base wall 220. The corresponding screw-holes (322 of FIG. 3) are preferably of a size smaller than the screw-holes 262, 263 to enable self-tapping screws to pass through the screw-holes 262, 263 and to engage the corresponding screw-holes (322 of FIG. 3) to removably bind the fourth side wall 260 to the upturned lip (321 of FIG. 3).

The edge 247 of the second side wall 240 is provided with a screw-hole 244. A corresponding, preferably smaller screw-hole (571 of FIG. 5) is provided in the cover wall 270 to allow a self-tapping screw to enter the screw-hole 244 and to engage the corresponding smaller screw-hole (571 of FIG. 5) to removably bind the cover wall 270 to the edge 247.

The cover wall 270 is further provided with a plurality of projections 271 that are located so as to engage with corresponding slots (334, 336, 354, 356 of FIG. 3) in inturned lips (333, 335, 353, 355 of FIG. 3) on the first and third side walls 230, 250. The projections 271 keep the inturned lips (333, 335, 353, 355 of FIG. 3) of the first and third side walls 230, 250 (and thus the first and third side walls 230, 250, as a whole) from separating or moving closer together, lending substantial structural integrity to the chassis 110 when the second chassis portion 210 is fully removably secured to the first chassis portion 200. Those skilled in the art will understand that the cover wall 270 can be provided with slots and the inturned lips can be provided with projections as opposed to the arrangement illustrated in FIG. 2.

In the illustrated, preferred embodiment of the present invention, the chassis 110 contains a stepped portion wherein cross-sectional area of the chassis 110 changes. The first and third side walls 230, 250 have corresponding stepped portions 232, 252, respectively, in which their height changes, as is apparent in FIG. 2. The cover wall 270 has a corresponding angled portion 280 to conform to the stepped portions 232, 252. In the illustrated embodiment, the angled portion 280 is provided with an aperture 281 for receiving the plurality of computer power supply lines (140 of FIG. 1) therethrough. However, those skilled in the art will understand that the angled and stepped portions 280, 232, 252 are not essential parts of the present invention.

Figure 3:
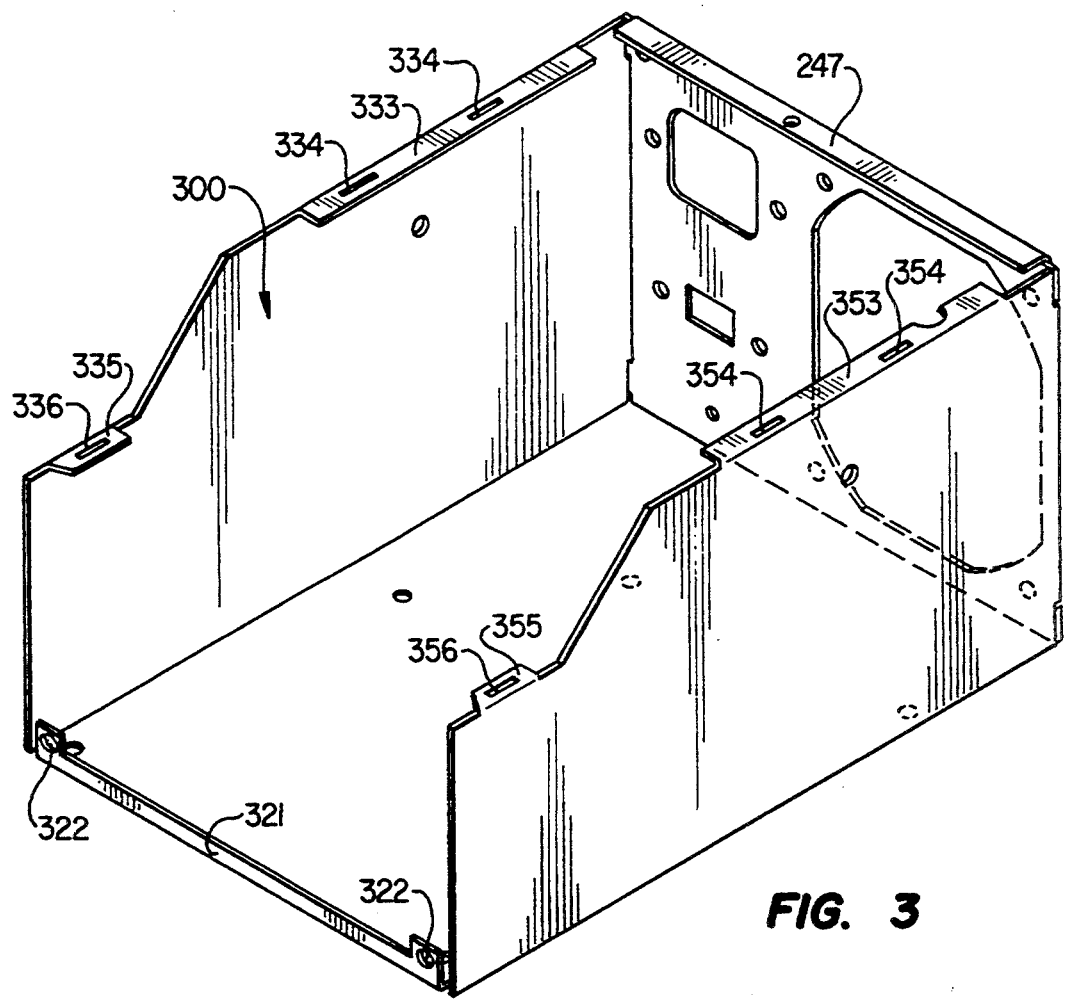
FIG. 3 illustrates a side isometric view of the first chassis portion of the chassis of FIG. 2.

Turning now to FIG. 3, illustrated is a side isometric view of the first chassis portion of the chassis of FIG. 2. FIG. 3 is presented primarily for the purpose of illustrating the opening 300 created when the second chassis portion 210 (of FIG. 2) is removed from the first chassis portion 200 and for illustrating the various inturned and upturned lips in the first chassis portion 200 following stamping and bending previously referenced and discussed in conjunction with FIG. 2.

Turning now to FIG. 4, illustrated is a plan view of the first chassis portion 200 of FIG. 3 after the step of stamping a bendable sheet and prior to the step of bending. The first chassis portion 200 is preferably stamped from a single bendable piece of sheet metal that is most preferably galvanized steel to resist corrosion over time. In addition to the screw-holes, apertures and slots previously referenced and described, FIG. 4 shows a plurality of holes 421, 432, 442, 444, 452 that may be used (1) to mount the chassis 110 within the main chassis 100 of FIG. 1, (2) to mount power supply electrical components or circuit boards containing the same within the chassis 110 or (3) to provide an electrical contact for the purpose of establishing the chassis 110 as an electrical ground. These holes may be stamped into the metal alone or in conjunction with corresponding conventional tab structures, the tab structures providing a standoff for the holes. Those skilled in the art are aware of such possibilities.

Once the first chassis portion 200 has been stamped, the various portions of the first chassis portion 200 are bent to form the finished portion 200 as particularly illustrated in FIG. 3. A central portion of the first chassis portion 200 forms the base wall 220 and is a reference as to all bending operations performed on the first chassis portion 200.

Preferably, the first bending operation bends the edge 247 with respect to the second side wall 240 (along a bend line 401), forms the upturned lip 321 on the base wall 220 (along a bend line 402) and forms the inturned lips 333, 335, 353, 355 on the first and third side walls 230, 250, respectively (along bend lines 403, 404, 405, 406, respectively).

A subsequent bend operation bends the second side wall 240 along a bend line 407 until the second side wall 240 is substantially perpendicular to the base wall 220. Then, the first and third side walls 230, 250 are bent until substantially perpendicular to the base wall 220 along respective bend lines 408, 409. As the first and third side walls 230, 250 bend into their final position, the projections 245, 246, 445, 446 on edges of the fourth side wall 240 mate with the corresponding projections 431, 251 on edges of the first and third side walls 230, 250, interlocking the projections 245, 246, 251, 431, 445, 446 and fixing the first, second and third side walls 230, 240, 250 with respect to one another so as to prevent undesirable lateral displacement or movement therebetween.

Figure 5:
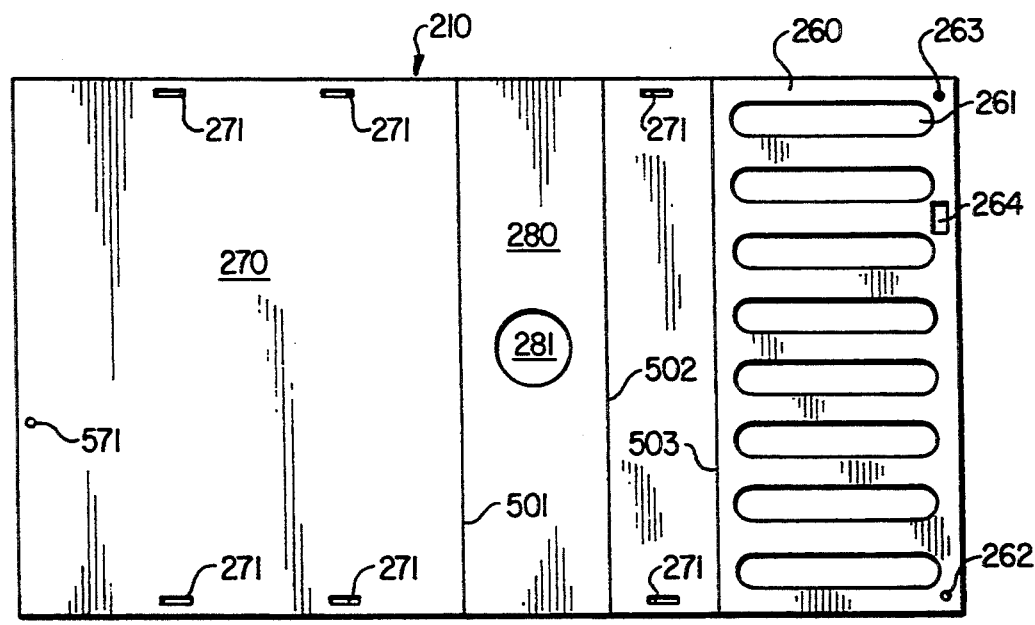
FIG. 5 illustrates a plan view of the second chassis portion of FIG. 2 after the step of stamping and prior to the step of bending.

Turning now to FIG. 5, illustrated is a plan view of the second chassis portion 210 of FIG. 2 after the step of stamping a bendable sheet and prior to the step of bending. The second chassis portion 210 is preferably stamped from a single bendable piece of sheet metal that is most preferably the same type of metal used for stamping of the first chassis portion 200.

In a first bending operation, the angled portion 280 is formed by bending appropriate angles into the cover wall 270 along bend lines 501, 502. Finally, the fourth side wall 260 is formed by bending along a bend line 503 until the fourth side wall 260 is substantially perpendicular to the cover wall 270.

Those skilled in the art will recognize that the present invention is not limited to application as a chassis for computer power supplies. Rather, the present invention provides a cost-attractive alternative to manufacture of many types of boxes, cabinets and chassis, whatever the application.

From the above description, it is apparent that the present invention provides an electronics chassis having a construction free of secondary fabrication operations comprising: (1) a first bendable chassis sheet having a central portion forming a chassis base wall and a plurality of peripheral portions bent with respect to the central portion to form respective first, second and third chassis side walls, edges of the first and third side walls having projections interlocking with corresponding projections on edges of the second side wall to fix the first and third side walls with respect to the second side wall as against lateral displacement, the first bendable chassis sheet thereby forming a chassis portion having an opening therein, (2) a second bendable chassis sheet mated to the first chassis sheet and covering the opening, the second chassis sheet having a first portion forming a chassis cover wall and a second portion bent with respect to the first portion to form a fourth chassis side wall, side edges of the cover wall and outer edges of the first and third side walls having interlocking projections and recesses preventing the first and third side walls from separating from the cover wall, (3) a structure for removably attaching a side edge of the cover wall to an outer edge of the second wall and (4) a structure for removably attaching an edge of the fourth side wall to an edge of the base wall.

Although the present invention and its advantages have been described in detail, it should be understood that various changes, substitutions and alterations can be made herein without departing from the spirit and scope of the invention as defined by the appended claims.

What is claimed is:

1. An electronics chassis having a construction free of secondary fabrication operations, comprising:
    a first bendable chassis sheet having a central portion forming a chassis base wall and a plurality of peripheral portions bent with respect to said central portion to form respective first, second and third chassis side walls, edges of said first and third side walls having projections interlocking with corresponding projections on edges of said second side wall to fix said first and third side walls with respect to said second side wall as against lateral displacement, said first bendable chassis sheet thereby forming a chassis portion having an opening therein;
    a second bendable chassis sheet mated to said first chassis sheet and covering said opening, said second chassis sheet having a first portion forming a chassis cover wall and a second portion bent with respect to said first portion to form a fourth chassis side wall, side edges of said cover wall and outer edges of said first and third side walls having interlocking projections and recesses preventing said first and third side walls from separating from said cover wall;
    means for removably attaching a side edge of said cover wall to an outer edge of said second wall; and
    means for removably attaching an edge of said fourth side wall to an edge of said base wall.

2. The chassis as recited in claim 1 wherein said chassis is a power supply chassis for a personal computer (PC).

3. The chassis as recited in claim 1 wherein said second side wall contains an aperture for receiving a fan.

4. The chassis as recited in claim 1 wherein said fourth side wall contains a plurality of ventilation apertures.

5. The chassis as recited in claim 1 wherein said side edges of said cover wall contain a plurality of projections and said outer edges of said first and third side walls contain a plurality of corresponding recesses for receiving said projections.

6. The chassis as recited in claim 1 wherein said first and second bendable chassis sheets are composed of metal.

7. The chassis as recited in claim 1 wherein said second side wall contains an aperture for receiving a line cord interface.

8. The chassis as recited in claim 1 wherein an angled portion of said cover wall contains an aperture for receiving a plurality of computer power supply lines therethrough, said computer power supply lines capable of providing power to components within a computer system.

9. The chassis as recited in claim 1 wherein said first, second, third and fourth side walls are substantially perpendicular to said base and cover walls.

10. The chassis as recited in claim 1 wherein said first and third side walls have corresponding stepped portions in which a dimension of said first and third side walls changes, said cover wall having a corresponding angled portion to conform to said stepped portions.

* * * * *